United States Patent [19]

McCauley et al.

[11] 3,939,003
[45] Feb. 17, 1976

[54] FABRICATION OF METAL-CERAMIC COMPOSITES

[75] Inventors: James W. McCauley, Wakefield; Dennis J. Viechnicki, Wellesley; Frederick Schmid, Marblehead, all of Mass.

[73] Assignee: The United States of America as represented by the Secretary of the Army, Washington, D.C.

[22] Filed: Feb. 15, 1974

[21] Appl. No.: 443,061

Related U.S. Application Data

[62] Division of Ser. No. 287,165, Sept. 7, 1972.

[52] U.S. Cl. .................. 106/65; 106/57; 106/62; 106/63; 106/73.4
[51] Int. Cl.² ................................. C04B 35/02
[58] Field of Search .......... 106/73.4, 57, 62, 63, 65, 106/42; 264/332; 23/305 A, 301 SP, 273 SP

[56] References Cited
UNITED STATES PATENTS

| | | | |
|---|---|---|---|
| 3,241,995 | 3/1966 | Pulfrich | 106/65 X |
| 3,369,877 | 2/1968 | Humenik et al. | 106/65 X |
| 3,527,574 | 9/1970 | La Belle | 106/65 X |
| 3,595,803 | 7/1971 | Dugger | 264/332 |
| 3,608,050 | 9/1971 | Carman | 106/65 X |
| 3,653,432 | 4/1972 | Schmid et al | 432/13 X |
| 3,796,673 | 3/1974 | Clark et al. | 23/301 SP |

*Primary Examiner*—Winston A. Douglas
*Assistant Examiner*—John F. Niebling
*Attorney, Agent, or Firm*—Nathan Edelberg; Robert P. Gibson; Vincent W. Cleary

[57] ABSTRACT

The unidirectional solidification of a metal-ceramic composite in a system comprising the positioning of a seed crystal in a crucible, adding a portion of premelted ceramic material, a metallic material, and the remainder of the premelted ceramic. The temperature of the ceramic material is raised to about 50°C above its melting point and then slowly decreased with a corresponding increase in the flow of an inert coolant gas through the system thereby unidirectionally solidifying the material to produce a single crystal having the orientation of the seed.

7 Claims, 4 Drawing Figures

U.S. Patent  Feb. 17, 1976  3,939,003
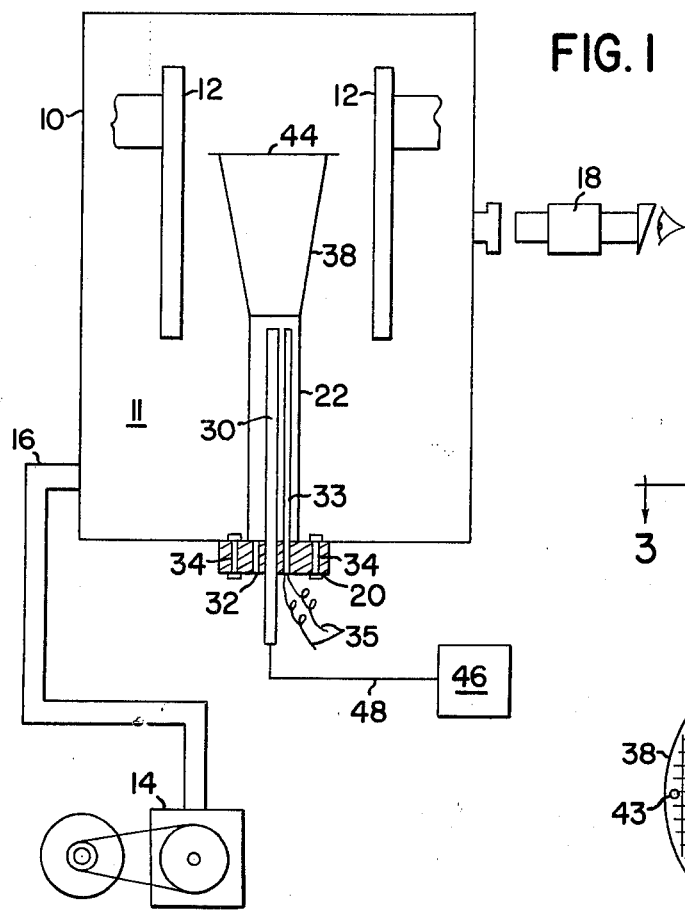
FIG. 1
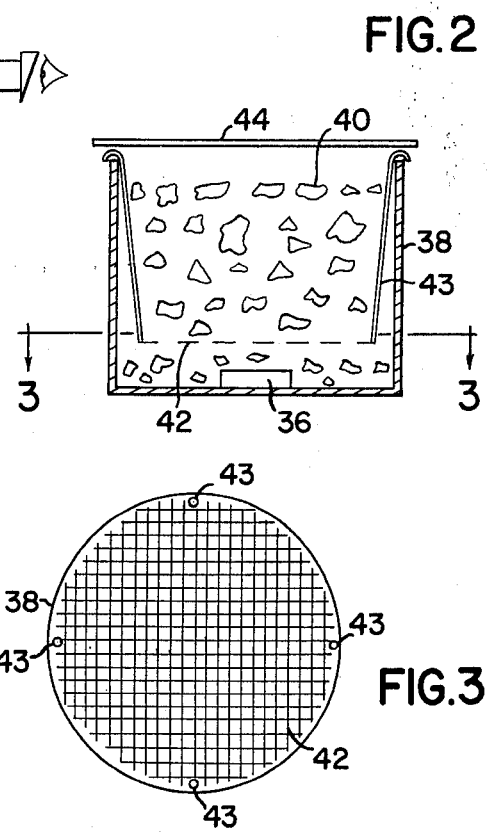
FIG. 2
FIG. 3
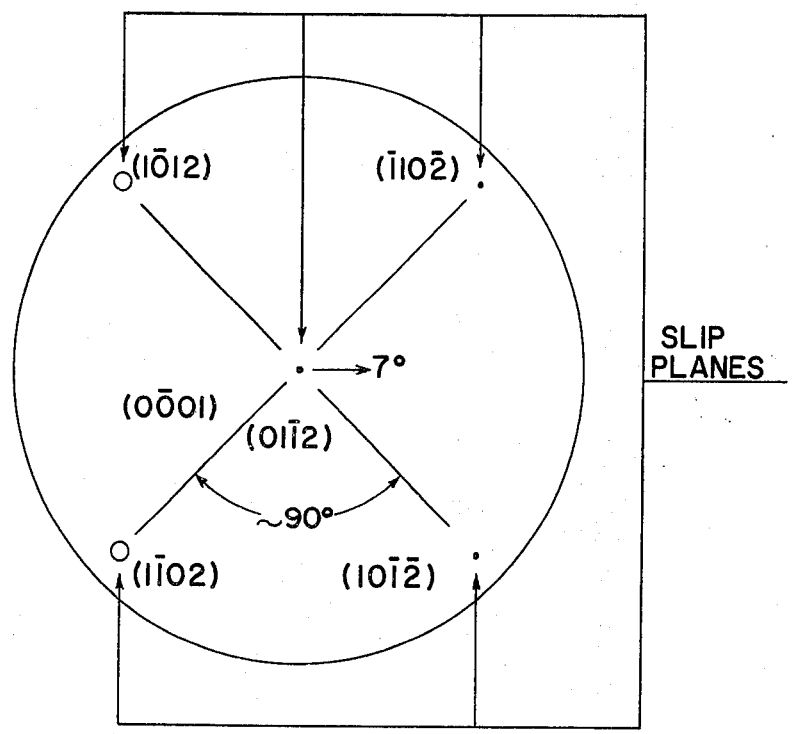
FIG. 4

FABRICATION OF METAL-CERAMIC COMPOSITES

The invention described herein may be manufactured, used, and licensed by or for the Government for governmental purposes without the payment to us of any royalty thereon.

This is a division, of application Ser. No. 287,165, filed Sept. 7, 1972.

This invention relates to the unidirectional solidification of a metal-ceramic material to obtain a metallic reinforced single crystal or eutectic ceramic.

High temperature oxide ceramic materials both single phase and multiphase such as $Al_2O_3$; $MgAl_2O_4$; $Y_3Al_5O_{12}$; $ZrO_2$; $Ca_5(PO_4)_3 F$, etc, offer many desirable properties as high temperature stability, transparency, chemical stability, high hardness and strength. These properties, however, are frequently overlooked for many potential applications because of their brittle characteristics. One particular example is the gas turbine engine where materials are needed not only to withstand high temperature, but also to withstand a high abrasion environment. Furthermore, use of these materials as non-corrosive structural elements demands not only high mechanical strength and resistance to chemical attack, but also a degree of "ductility" analogous to reinforced concrete. Incorporation of metals into the ceramic materials could solve all of the above mentioned problems, provided the properties of the ceramic and of the metal are not significantly degraded and that a strong bond could be obtained between the metal and the ceramic. Previous attempts at incorporating metals into non-concrete ceramic have used solid state reaction processes and resulted in only limited success because the formation of reaction phases at the ceramic-metal interfaces would downgrade properties.

Oxide melts have been contained in refractory metal crucibles such as molybdenum or tungsten with no apparent reaction between the melt and the crucible. Therefore, it was considered that refractory metals and alloys such as molybdenum, tungsten, columbium, etc., in the form of single strands and/or woven continuous mesh could be incorporated into oxide ceramics such as $Al_2O_3$, $MgAl_2O_4$, $Y_3Al_5O_{12}$, $ZrO_2$, $Ca_5(PO_4)_3 F$, and ceramic eutectics such as $Al_2O_3/ZrO_2$ and $Al_2O_3/MgAl_2O_4$, yielding ceramic-metal composites. It is expected that the metal-ceramic composites will exhibit mechanical properties which are somewhere between those of the metal and of the ceramic. In other words, the composite would yield plastically before catastrophic, i.e., brittle, failure. The degree of plasticity would depend on the orientation of the seed crystal, configuration, amount and type of metal incorporated into the ceramic. However, it is possible not only to have a decrease in strength at the expense of an increase in ductility, but also to synergistically enhance the mechanical properties.

The properties of the metal-ceramic composites would be controlled by the configuration of the incorporated metal or alloy, and the relative properties of the metal and the ceramic. For example, the relative thermal expansion of the metal and ceramic will greatly influence the mechanical properties of the composite. If the ceramic contracts much less than the metal upon cooling from the processing temperature, the metal will pull away from the ceramic leaving a network of pores thereby having a detrimental effect on the strength of the material. If the ceramic contracts much more than the metal upon cooling, the ceramic may be highly strained with a resultant drop in strength. The relative thermal expansion of the two phases must be optimized. For example, if columbium mesh is oriented parallel with the a axis of sapphire, the matrix of the sapphire will be put into compression since its thermal expansion is greater than the expansion in the a direction. In said case, it is considered that the strength of the metal-sapphire composite would be superior to that of sapphire, besides being able to yield plastically before failure. However, if the columbium mesh is oriented parallel with the c axis of sapphire, the matrix will be in tension since the expansion coefficient of columbium is less in this direction. In all cases, the seed used in the crystal growth process must be oriented in such a way as to eliminate cracking in the final composite material. In addition, the seed crystal may be oriented in a melt so that the slip planes takes up the stresses induced in the growing system in accordance with the method of Jarda L. Caslavsky, et al. AMC Docket No. 6228, which is the subject of an application filed July 28, 1972, Ser. No. 276,213, assigned to the same assignee as this application, the Government of the United States, as represented by the Secretary of the Army.

It is an object of the present invention to provide and disclose a metal-ceramic composite having improved properties.

It is a further object of the invention to provide and disclose a metal-ceramic composite formed from a single crystal.

It is a further object of the invention to provide and disclose a metal-ceramic composite formed from a single crystal by the orientation of a seed crystal in a melt so that the slip plane takes up stresses induced in the growing crystal.

It is a further object of the invention to provide and disclose a metal-ceramic formed from a single crystal without any degradation of the metal or ceramic.

It is a further object of the invention to provide and disclose a metal-ceramic composite formed from a single crystal comprising a chemical and mechanical bond between the metal and ceramic.

Other objects and a fuller understanding of the invention may be had by referring to the following description and claims taken in conjunction with the accompanying drawing in which:

FIG. 1 is a schematic illustration of the gradient furnace system utilized.

FIG. 2 is an illustration of an elevated sectional view of a loaded crucible.

FIG. 3 is a view through 3—3 of FIG. 2.

FIG. 4 is a schematic illustration of the orientation of a slip plane of a seed crystal parallel to the bottom of a crucible.

The system utilized was devised by Frederick Schmid et al and is the subject of U.S. Pat. No. 3,653,432 issued Apr. 4, 1972. The system comprises housing 10, suitably contoured to form chamber 11. Heating means 12, constructed of any suitable refractory material, e.g., graphite, are positioned in chamber 11. Any conventional heating means, e.g., electrical resistance, may be utilized. The heating means are connected to any suitable electrical outlet, not shown. Vacuum pump 14 is utilized to apply a low vacuum to the chamber of the furnace through conduit means 16. The temperature of the furnace is indicated by any conventional means, e.g., pyrometer 18.

The heat exchanger comprises solid cylindrical base segment 20 and upper reduced hollow cylindrical segment 22. Base segment 20 may be constructed of any suitable material, e.g., molybdenum. The top portion of segment 22 forms a flat surface which is not shown. Concentric tubing 30, which has open ends, extends through base segment 20 to a point near the top of reduced segment 22. Concentric tubing 30 may be constructed of a material having the ability to withstand high temperature, oxidation and thermal shock, e.g., molybdenum. Exit bore 32 extends through base segment 20 and connects the interior of reduced segment 22 with the atmosphere.

Thermocouple 33 which is positioned in the interior of reduced segment 22, is connected to any suitable temperature indicator means by leads 35. Base segment 20 of the heat exchanger is attached to housing 10 by means of bolts 34. The bolts are positioned in bores 36 of base segment 20. Reduced segment 22 of the heat exchanger is inserted through an opening, not shown of housing 10.

In operation, seed crystal 36 is positioned in crucible 38, as shown in FIG. 2. Seed crystal 36 and the bottom of crucible 38 are covered with premelted ceramic material 40. Metallic component 42, which is attached to support means 43 is positioned on top or premelted ceramic material 40. The open end of the crucible is then covered with a sheet of refractory metal 44.

The crucible is positioned in chamber 11 on top of the heat exchanger, as shown in FIG. 1. A vacuum is applied and the heating elements are activated, raising the temperature to about 50°C above the melting point of the ceramic material. Concurrently, a coolant inert gas is bled from storage 46 through conduit 48 and into concentric tubing 30. The gas cools the base of crucible 38 and exits through bore 32 to the atmosphere. In the alternative, the gases may be collected, cooled and returned to storage. The temperature of the furnace is slowly decreased with a corresponding increase in the flow of coolant gas through the heat exchanger, thereby unidirectionally solidifying the ceramic material to form a single crystal.

In a specific example, a sapphire seed is cut with proper axis orientation from a bar stock of a commercially available material. The sapphire seed crystal is positioned in the bottom of a molybdenum crucible having a diameter of about 2 inch and a height of around 2 inch. The seed is oriented so that the $01\bar{1}2$ plane will be in the plane of the crucible bottom. In that position, the crystal seed, is tilted so that the $(01\bar{1}2)$ pole is moved 7° in direction away from the basal plane, i.e., $(0001)$, and the four poles of the slip planes shown in FIG. 4 are moved to the sapphire edge. Since the slip planes shown are approximately 90° from each other and from the sterographic center, i.e., $(01\bar{1}2)$, the growth velocities will be isotropic so that the growing crystal will fill the crucible evenly, minimizing the contraints on the crystal and therefore reducing the stresses on the crystal. In addition to the $(01\bar{1}2)$ plane, the seed crystal may be oriented in the: $(\bar{1}10\bar{2})$, $(10\bar{1}\bar{2})$, $(\bar{1}012)$, $(1\bar{1}02)$ and $(01\bar{1}2)$ planes. Premelted sapphire along with a two dimensional net of molybdenum, i.e., 20 by 20 mesh, were added as shown in FIG. 2. The wires of the mesh were 0.007 inch in diameter. The net was suspended by molybdenum means 43. The charged crucible was covered and placed in the gradient furnace as shown in FIG. 1. Metal cover 44 is positioned over the open end of the crucible in order to reflect heat radiation back to the melt surface. After evacuation to $5 \times 10^{-2}$ torr, the furnace is turned on and helium bled into the heat exchanger at a slow rate, ca. 4 cubic feet per hour (cfh) in order to prevent oxidation of the refractory metal heat exchanger. The temperature of the furnace is increased at a sufficiently slow rate, ca. 11°C/min, to prevent the pressure in the furnace from exceeding $2 \times 10^{-1}$ torr. As the melting point of the ceramic material is reached, the flow of helium into the heat exchanger is increased to, ca. 4 cfh to prevent the melt from boiling over the top of crucible when melting occurs and also to prevent the seed from melting. The temperature of he melt is then increased to 50° above the melting point of the $Al_2O_3$, i.e., 2100°C. Because molybdenum melts at 2610°C in vacuum, the wire screen remains solid. The helium flow is then decreased, ca. to 8 cfh to permit partial melting of the seed crystal. When solidification commences, the solid nucleates on the seed and assumes its crystallographic orientation. The thermocouple positioned in the heat exchanger registers the temperature of the center of the seed. The temperature of the center of the seed is not allowed to increase above the melting point of the material by controlling the flow of helium into the heat exchanger. To start solidification of the ingot, the flow of helium is increased gradually in small increments (ca. 0.5 cfh/min) to about 100 cfh to extract heat from the melt in a controlled fashion so that the solid grows from the seed crystal. The melt temperature is then decreased at a rate 2°C/min by decreasing the furnace power until a temperature 30°C below the melting point of the material is reached. This temperature is maintained while the flow of helium is decreased at a rate of 2 cfh/min until a flow rate, e.g., 4 cfh. necessary to prevent oxidation of the heat exchanger, is reached. The furnace power is then terminated and the single crystal allowed to cool to 50°C in a period of 16 hours.

The sapphire actually grew through the molybdenum screen. Subsequent X-ray analysis using a Laue back reflection technique showed that the sapphire did not change orientation when it grew through the screen. Photomicrographs of strands of the molybdenum screen surrounded by $Al_2O_3$ indicated no evidence of degradation of metal or ceramic. Scanning a similar area for characteristic X-radiation of molybdenum and aluminum in an electron probe microanalyzer indicated that diffusion of molybdenum into the sapphire, and aluminum into the molybdenum occured only to a depth of about 20 micromillimeter. A chemical bond, as well as the mechanical bond formed by the "mismatch" in thermal expansion, was present to hold the two phases together.

Crystals grown by the present method may be utilized to seed subsequent melts without further orientation of the seed crystal. Various metals and configurations thereof can be utilized in combination with a ceramic depending on the desired application of the resultant metal-ceramic composite. In addition to the illustrative two-dimensional net, i.e., wire screen, one dimensional wire strands or a three dimensional wire net may be used.

Although we have described our invention with a certain degree of particularity, it is understood that the present disclosure has been made by way of example and that numerous modifications may be made without departing from the spirit and scope of the invention.

Having described our invention, we claim:

1. A constrained single crystal metal ceramic grown from seed in a crucible and having the orientation of the seed, said crystal having incorporated therein a metallic net, the metallic net having been positioned so that on the unidirectional solidification of the ceramic material, the crystal grew through the metallic net.

2. A single crystal in accordance with claim 1 wherein said metal ceramic composite includes a metallic component, and wherein the metallic component is selected from the group consisting of tungsten, molybdenum, and columbium.

3. A single crystal in accordance with claim 2 wherein said metal ceramic composite includes a ceramic component, and wherein the ceramic component is selected from the group consisting of $Al_2O_3$, $MgAl_2O_4$, $Y_3Al_5O_{12}$, $ZrO_2$, $Ca_5(PO_4)_3F$; $Al_2O_3/ZrO_2$, and $Al_2O_3/MgAl_2O_4$.

4. A single crystal in accordance with claim 3 wherein the ceramic component is sapphire and the metallic component is molybdenum.

5. A single crystal in accordance with claim 3 wherein the metallic component is selected from the group consisting of tungsten, molybdenum, and columbium.

6. A single crystal in accordance with claim 1, wherein said ceramic component is $Al_2O_3$.

7. A single crystal in accordance with claim 1, wherein said ceramic component is sapphire.

* * * * *